United States Patent [19]
Ito et al.

[11] Patent Number: 5,547,924
[45] Date of Patent: Aug. 20, 1996

[54] SUPERCONDUCTIVE CERAMIC COMPOSITE MATERIAL

[75] Inventors: Yoshitaka Ito; Masami Ishii; Takayuki Nishio; Uichiro Mizutani; Yuh Yamada; Fumihiko Ogasawara; Motohiro Suganuma, all of Aichi, Japan

[73] Assignee: Aisin Seiki Kabushiki Kaisha, Kariya, Japan

[21] Appl. No.: 531,830

[22] Filed: Sep. 21, 1995

Related U.S. Application Data

[63] Continuation of Ser. No. 852,336, Mar. 17, 1992, abandoned, which is a continuation of Ser. No. 329,678, Mar. 28, 1989, abandoned.

[30] Foreign Application Priority Data

Mar. 28, 1988 [JP] Japan .................................. 63-73968

[51] Int. Cl.$^6$ ........................... C04B 35/505; C04B 35/65
[52] U.S. Cl. ........................... 505/500; 505/300; 505/725; 505/780; 505/781; 252/521
[58] Field of Search ........................... 505/300, 733, 505/737, 738, 780, 781, 124, 978, 500; 252/521

[56] References Cited

U.S. PATENT DOCUMENTS

| | | | |
|---|---|---|---|
| 3,951,870 | 4/1976 | Erewamy et al. | 252/506 |
| 4,762,754 | 8/1988 | Nellis et al. | 424/552 |
| 4,826,808 | 5/1989 | Yurek et al. | 505/1 |
| 4,892,861 | 1/1990 | Ray | 505/1 |
| 5,145,836 | 9/1992 | Chen et al. | 505/781 |

OTHER PUBLICATIONS

McCallum et al "Problems in the Production of $YBa_2Cu_3O_x$ Superconding Wire" Advanced Ceramic Materials, vol. 2, No. 3B, Special Issue. Jul. 1987 pp. 388–400.

"Science and Technology", The Economist pp. 87–88 Feb. 21, 1987.

"Breakthrough Seen in Magnet Research"—New York Times—Wed. Mar. 18, 1987.

*Superconducting Properties of $YBa_8Cu_3O_{7-\delta}$ Doped with Various Metals and Oxides* Sherwood et al., Symposia Proceedings of the Matls. Res. Society vol. 99, Apr. 1988.

"Superconducting Properties of Y–Ba–Cu–Pt–O" Korachev et al. Int'n'l J. of Mod. Phys. B., vol. 1 No. 2 1987 pp. 223–229.

"Fabrication Of Dense $Ba_2YCu_3O_{7-\delta}$ Superconductor Wire By Molten Oxide Processing" by S. Jin et al, Appl. Phys. Lett., vol. 51, No. 12, pp. 943–945, Sep. 21, 1987.

"High $T_c$ Superconductors—Composite Wire Fabrication" by S. Jin et al, Appl. Phys. Lett., vol. 51, No. 3, pp. 203–204, Jul. 20, 1987.

*Primary Examiner*—Paul Lieberman
*Assistant Examiner*—M. Kopec
*Attorney, Agent, or Firm*—Burns, Doane, Swecker & Mathis, L.L.P.

[57] ABSTRACT

A superconductive ceramic composite material with high strength and capable of plastic deformation is prepared by mixing and sintering a superconductive powder represented by $(RE_xAE_{1-x})_{1-y}Cu_yO_z$ (RE represents Y or a rare-earth element having an atomic number of 57–71, or a combination of at least two of these elements, AE is at least one of alkaline earth elements Ca, Sr and Ba, x is 0.13–0.67, y is 0.25–0.67, and z is 1.08–1.17) and a metal powder M (M represents at least one of noble metals Rh, Pd, Ag, Ir, Pt and Au), in a defined ratio. The deformation (e.g., rolling) is followed by reheat-treatment (resintering). The powder mixture can be enclosed in a metallic capsule or made into a clad sheet by interposing the powder within two metallic sheets, and deformed (drawn or press formed into a desired shape) followed by sintering. The composite material may contain a superconductive network of such grains.

21 Claims, 14 Drawing Sheets

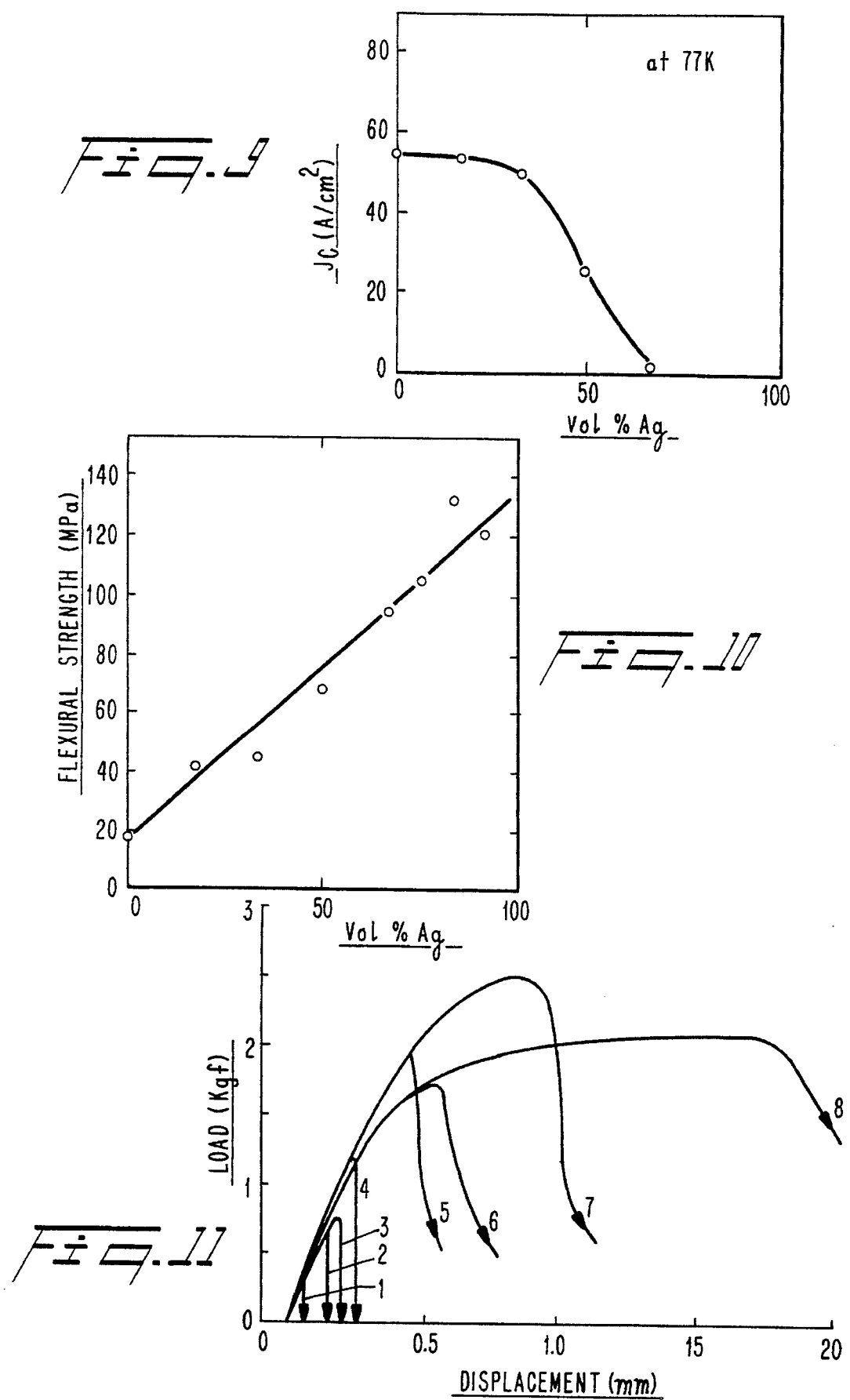

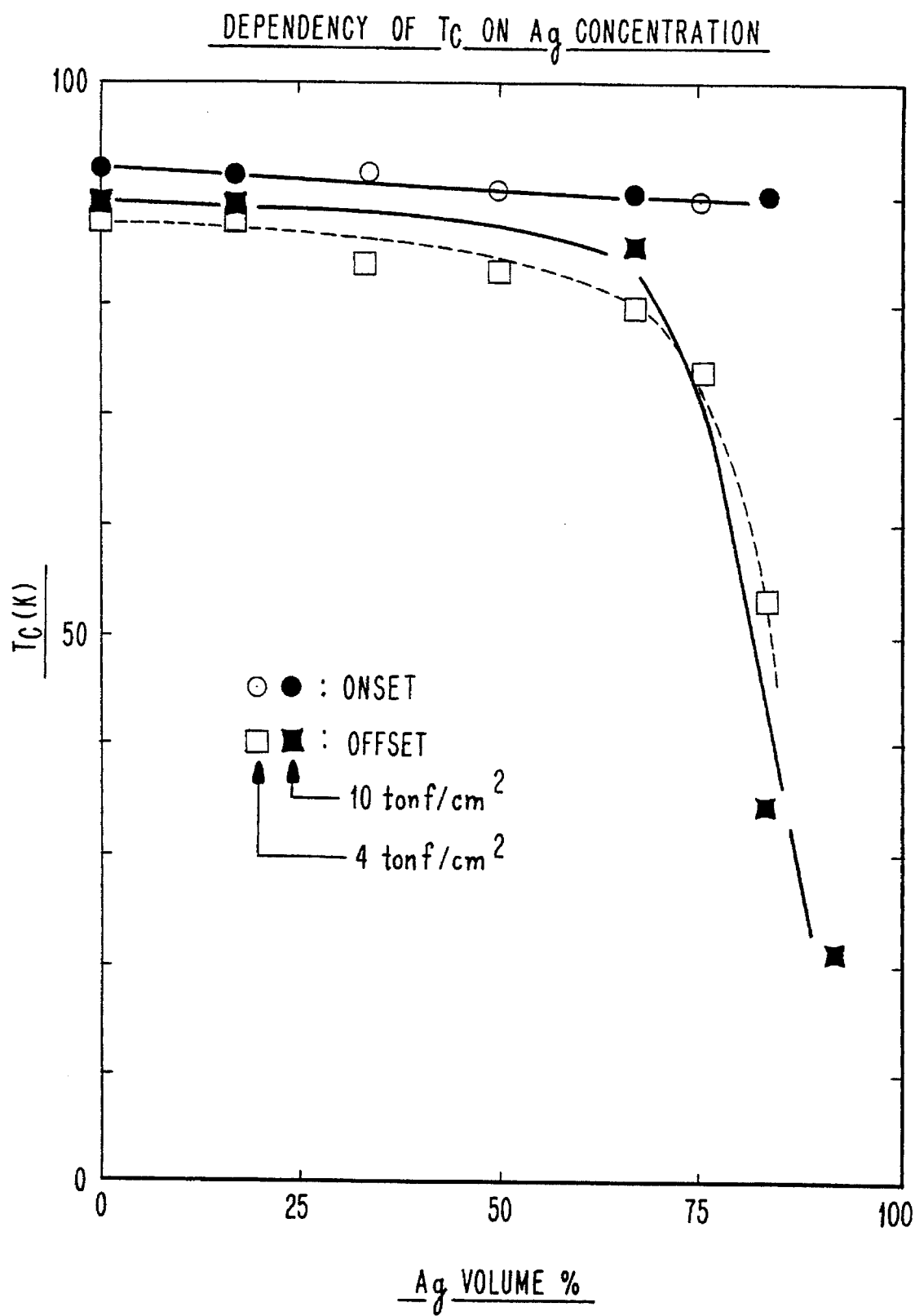

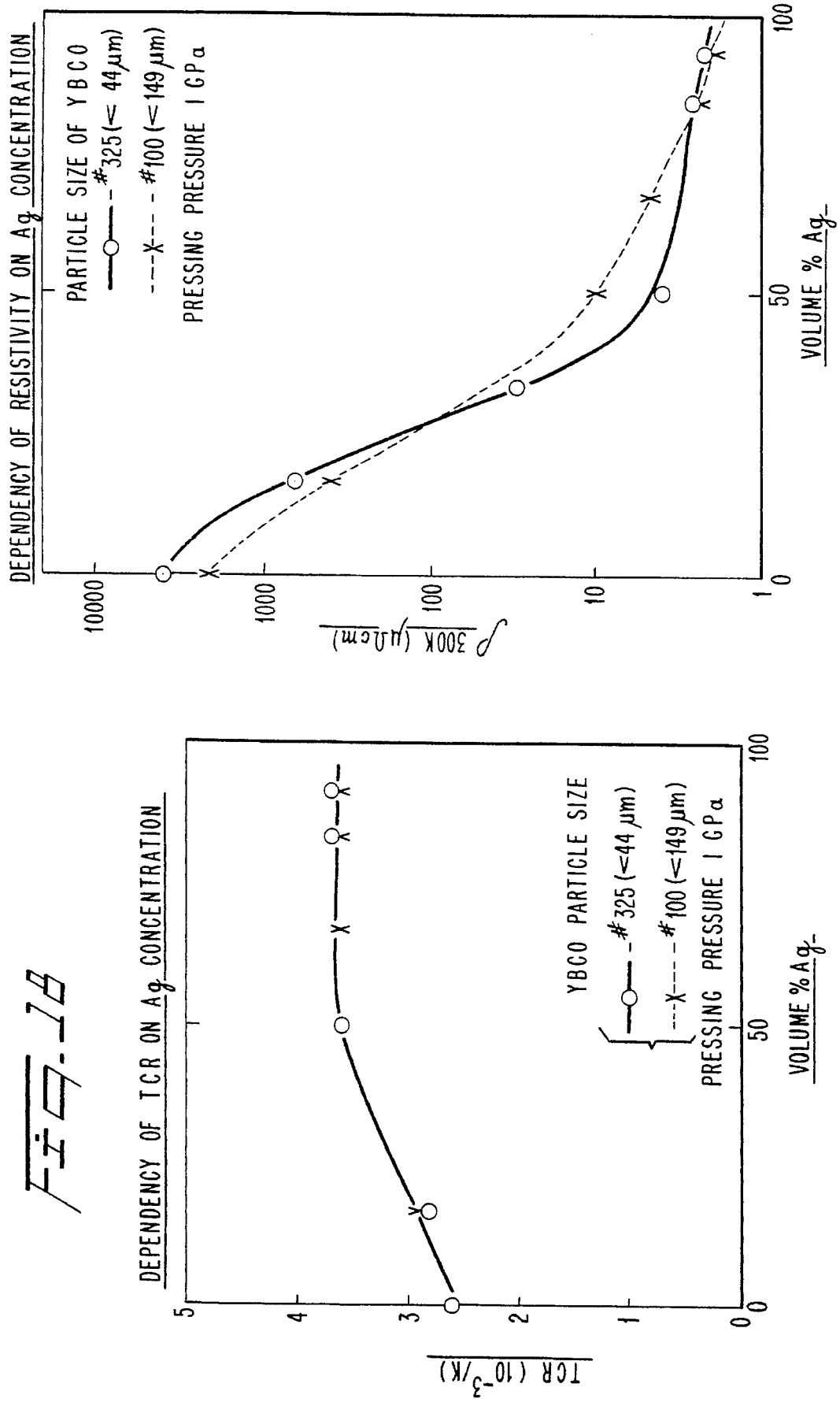

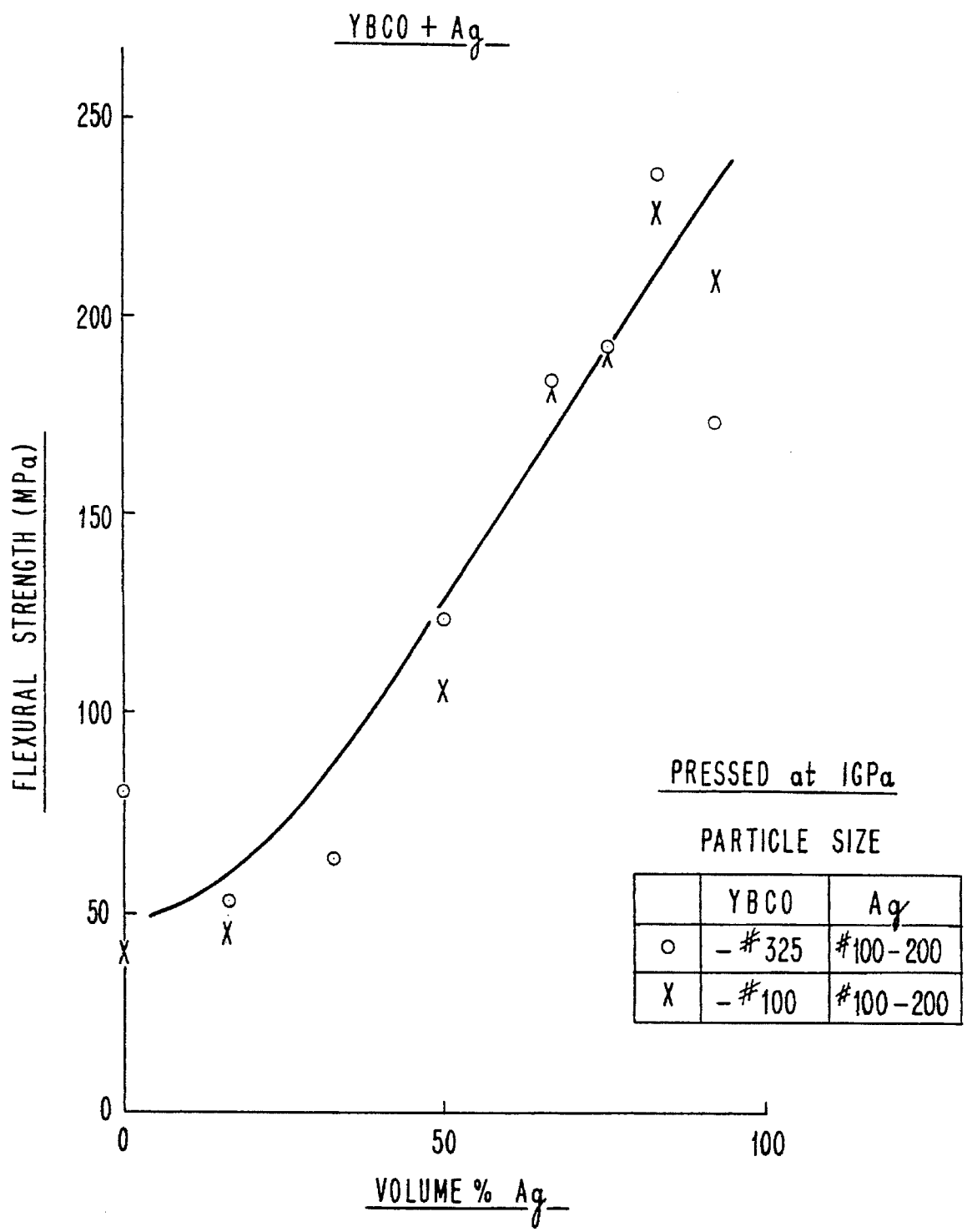

Fig. 22A
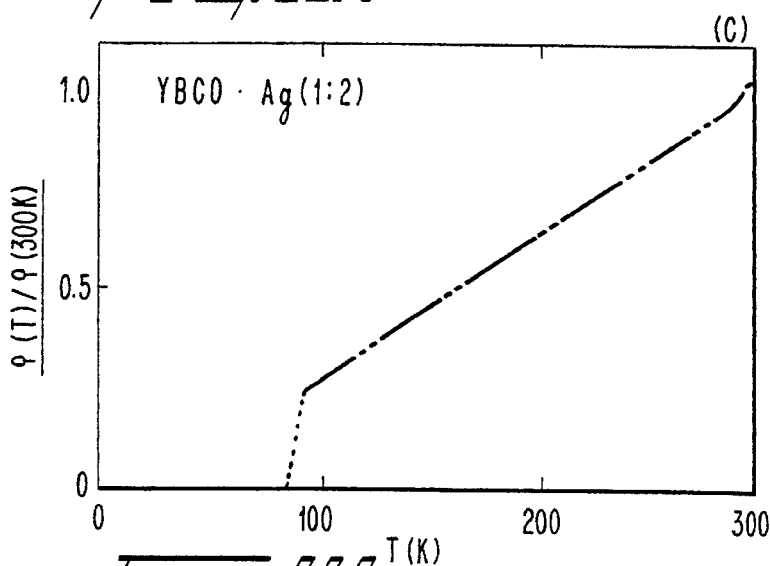
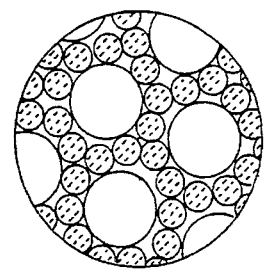
Fig. 22B
Fig. 22C
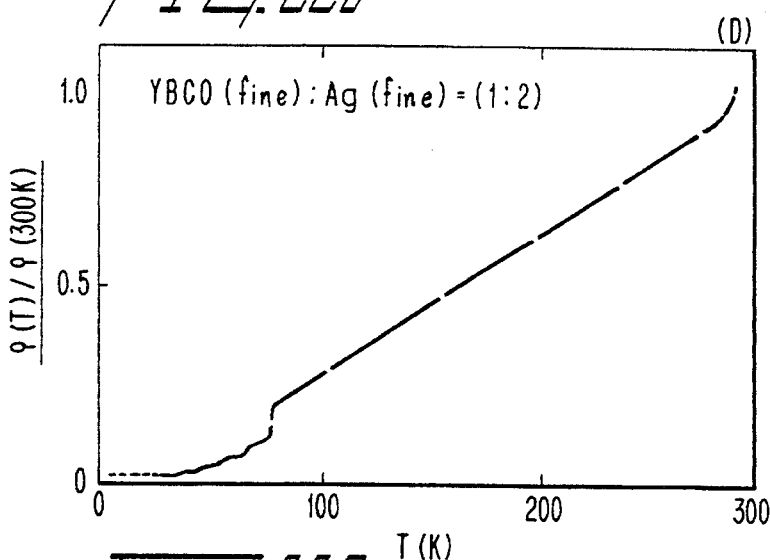
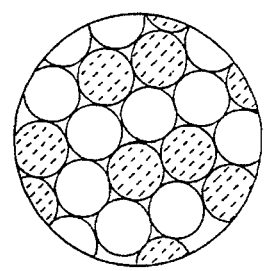
Fig. 22D
Fig. 22E
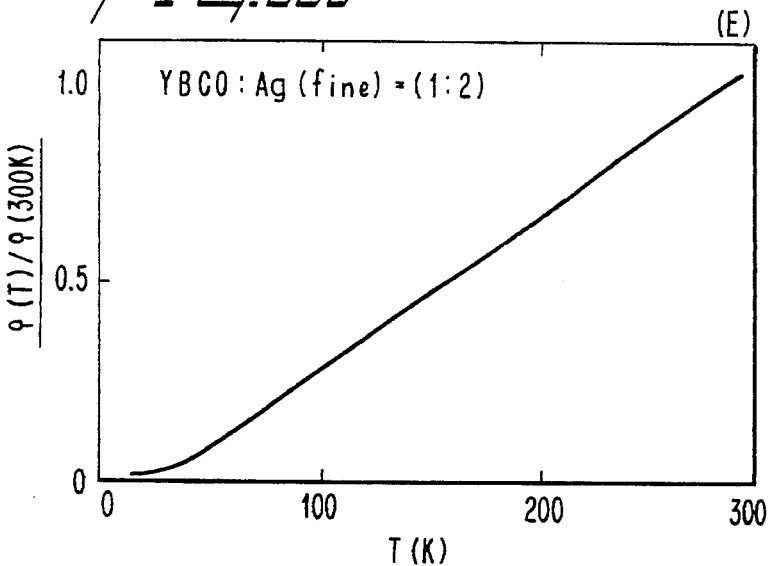
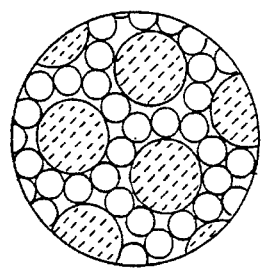
Fig. 22F

SUPERCONDUCTIVE CERAMIC COMPOSITE MATERIAL

This application is a continuation of application Ser. No. 07/852,336, filed Mar. 17, 1992, now abandoned which is a continuation of application Ser. No. 07/329,678, filed Mar. 28, 1989 now abandoned.

FIELD OF THE INDUSTRIAL UTILIZATION

This invention relates to a superconductive ceramic composite material which has an improved strength and forming and working properties without deteriorating superconductive properties, such as critical temperature Tc, critical current density Jc, Meissner effect and the like. The present invention can be applied to the energy field in which wires having strength are needed, such as generation of electric power, transmission and distribution of electric power, electronic devices and the like, the traffic and transportation find, such as magnetic floating trains, superconductive valves and the like, and various other fields utilizing wires and coils, and is further utilized as magnetic shield materials in the information and communication field, the research and development field in universities, laboratories and the like, and other fields.

BACKGROUND

As superconductive ceramics to which the present invention relates, there are the La-Sr-Cu-O system, Y-Ba-Cu-O system and the like having a high superconductive critical temperature Tc exceeding 40K or 90K. Since these ceramics do not require expensive liquid helium as a refrigerant, and can realize a superconductive state by a relatively simple apparatus, they are expected to be applied to various finds fields as new materials replacing conventional superconductive materials.

(Literature 1: Preprints of the Seventh Research Forum on Electronic Materials, pp. 6–7, Literature 2: G. W. Crabtree et al., Advanced Ceramic Materials, Vol. 2, No. 38, Special Issue (1987), pp. 444–456).

PROBLEMS TO BE SOLVED BY THE INVENTION

It is extremely difficult, however, to form or work the above-described superconductive ceramic into wires, tapes, sheets and the like due to hard and fragile properties which are inherent in ceramics. This is one of problems which hinder practical utilization of these ceramics.

The flexural strengths (flexural fracture strengths in the above-described Literatures) of single bodies of both of the above-described Y-Ba-Cu-O system and La-Sr-Cu-O system superconductive ceramics have small values which are inherent in ceramics, and hence these ceramics are very fragile.

Consequently, it has been impossible to directly form or work the superconductive ceramics. In order to overcome the fragility, various forming and working methods are being performed. Although a material worked by a working method utilizing a metal cladding or coating, which is a method now mainly used, has enough strength as an article to be worked, the strength of the ceramic portion itself having superconductive properties is not changed. Hence, it has a disadvantage in that it is damaged by bending or shock and its properties deteriorate.

SUMMARY OF THE DISCLOSURE

It is an object of the present invention to provide a novel superconductive material.

It is another object of the present invention to provide a superconductive material which has a strength higher than conventional ceramics by at least a predetermined amount, in which damage by an external force and deterioration of superconductive properties caused thereby are prevented, and which has high reliability.

Further objects will become apparent in the entire disclosure.

The above-described objects are achieved as follows.

The present invention provides a sintered superconductive ceramic composite material comprising a superconductive powder represented by $(RE_xAE_{1-x})_{1-y}Cu_yO_z$ (RE represents Y or a rare-earth element having an atomic number of 57–71, or a combination of at least two of these elements, AE is at least one of alkaline earth elements Ca, Sr and Ba, x is 0.13–0.67, y is 0.25–0.67, and z is 1.08–1.17) and a metal powder M (M represents a noble metal Rh, Pd, Ag, Ir, Pt or Au, or a mixture of these elements) in a defined ratio.

Useful values of Tc is obtainable at an Ag amount of 10–95 vol % which can be used at liquid helium temperature (4.2K) or above, and at 10—about 70 vol % Ag which can be used at liquid nitrogen temperature up to about 70 vol % Ag which is between (5) and (6) of FIG. 4, Tc remains unchanged. At 75 vol % Ag, Tc begins to decrease (FIG. 4-(6)). Such use is contemplated for instance as a thermosensor or a thermal switch or the like.

Useful values of Jc (as measured per the cross section of the entire material) are obtainable also at 10–95 vol % Ag for use at 4.2K or above and at 10–70 vol % Ag for use at 77K or above. Such use is contemplated for instance as a fuse material. It should be noted that at a slight amount of e.g., 5 vol % or more, Jc increase per the cross section of YBCO grains is observed.

The satisfactory flexural strength can be achieved at 10–95 vol % Ag in which a higher strength than for the pure YBCO is obtained, and preferably at 40–80 vol % Ag in which a strength doubled that of or higher than that of pure YBCO is obtained.

Useful TCR values can be achieved at 10–95 vol % Ag in which range a TCR difference from TCR of Ag (e.g., pure Ag) can be adjusted in a precise manner, and at 50–95 vol % Ag where matching in the TCR with Ag (e.g., pure Ag) is attained. Such use will encompass use as a bridge resistance.

Useful electric resistivity at 300K (ρ300K) is obtainable in a widest range (0%<Ag≦95 vol %), wherein a relatively high resistivity can be obtained at 10–40 vol % Ag and a relatively low resistivity is obtainable at 40–95 vol % Ag. The former range is contemplated as a resistor element while the latter range is contemplated as an electric wire material. In this regard a small amount of Ag (e.g., 1 to a few vol %, 5 or up to 10 vol %) can be also selected for adjusting the resistivity.

With respect to the deforming property, the presence of Ag in a substantial amount (10 vol % or more) permits plastic deformation, and the deformation (by pressing, rolling or the like) is possible at the YBCO: Ag ratio of 1:1 or more Ag. It is preferred to reheat-treat the deformed or rolled mass at the same conditions as the sintering step (hereinlater described) so that the deformed and disturbed microstructure (particularly destroyed YBCO network) of the sintered body can be reformed. This possibility provides a significant advantage in that the desired shape is obtainable free of limitation of the shape at which sintering is performed. This is true also for the case where the local YBCO network or agglomeration is observed, e.g., like FIG. 22(c).

Not only the volumetric ratio of YBCO: Ag powders but to a greater extent the grain size relationship between those powders define the microstructure as to whether or not YBCO network is established. An intermediate state (i.g., local network) is produced even at a greater amount of Ag powder when the grain size of both powders are similar (refer to FIG. 22 (D)).

The metal is selected so as to permit the sintering without oxidation in the temperature range 800°–980° C. at which YBCO powder can be sintered. The metal includes such metals having a Melting Point (M.P.) of about 1300° C. or less. The metal comprises Ag, Au or Ag-Au alloy (0<Au<100 at%); alloys (or mixtures) of Ag and/or Au with at least one other noble metal (Pd, Pt, Rh, Ir) or a mixture of those metals. The latter alloys embrace Ag-Pd(0<Pd≦40 at %), Ag-Pt(0<Pt≦85 at %), Ag-(Pd,Pt) (0<(Pd,Pt)≦40 at %), Au-Pd(0<Pd≦20 at %), Au-Pt(0<Pt≦50 at %) or the like.

The metal may be replaced (entirely or partly) by metal oxides which release oxygen during the sintering such as oxides of Ag, Au or a mixture thereof.

According to another aspect of the present invention, the composite sintered body as hereinabove described may be formed within a metallic container (e.g. , sheath, tube or capsule entirely or partly closed) or interposed between two metal layers (e.g., as clad sheet). For instance, a silver or copper sheath is used, in which the powder mixture is charged and sintered. Various modification may be done in this aspect. The charged sheath can be:

(i) simply sintered, (ii) subjected to first drawing (or rolling) followed by sintering, (iii) after the step (i), subjected to rolling followed by reheat-treatment (iv) after the step (ii), subjected to rolling followed by reheat-treatment As already mentioned, the reheat-treatment is made substantially under the same condition as the sintering.

According to a further aspect of the present invention there is provided a process for producing the sintered composite material according to the preceding aspects hereinabove mentioned. The process comprises:

preparing a powder mixture of a superconductive powder and a metal powder M, the superconductive powder being represented by $(RE_xAE_{1-x})_{1-y}Cu_yO_z$ where RE represents, Y or a rare-earth element having an atomic number of 57–71, or a combination of at least two of these elements, AE is at least one of alkaline earth elements Ca, Sr and Ba, x is 0.13–0.67, y is 0.25–0.67, and z is 1.08–1.17, and the M representing at least one of noble metals Rh, Pd, Ag, Ir, Pt and Au, and sintering the resultant mixture in a fresh oxygen atmosphere under the conditions such that the powder mixture is densified.

The sintering may be made by subjecting a compact to heat treatment at a temperature of the melting point of the YBCO or below at which the compact is densified and consolidated without reaction of YBCO with the metal. The sintering followed by gradual cooling (about 2°–3° C./min or slower) at which the high temperature semiconductive phase (tetragonal) of YBCO can be completely transformed to the low temperature superconductive phase (orthorhombic) through the transformation temperature of 500°–600° C. In the case where Ag is used as the metal powder, the heat treatment can be made at a temperature 800° C.–980° C. (preferably 850°–960° C.), for a period of time to sufficiently densify and consolidate the compact. The sintering is made preferably in an oxygen flow usually at atmospheric pressure (1 atm. absolute) or above. The oxygen flow is preferred so as to remove the volatile components from the heated mass. Cold pressing followed by sintering is usually satisfactory. However, other press-sintering methods may be employed, e.g., hot press (HP) sintering, hot isostatic pressing (HIP) subject to optimization of the conditions (pressure, atmosphere, temperature, etc.)

The present composite material of the above-described superconductive ceramics has a strength which is several times that of a sole (or single) ceramic body in accordance with the ratio of a mixed metal element, as shown in FIG. 10. The strength differs depending on the kind of the metal element, mixing ratio and preparation conditions. In the case where Ag is mixed, a nearly identical amount of strength can be obtained with 50 vol % Ag even at a low-pressure press as low as ⅛–1/10 of the pressure which is applied in the conventional case. In other words, a strength higher than that for sole bodies disclosed in the above-described Literatures can be obtained under identical preparation conditions. With respect to the deformation property, the present composite material has a plastic deformation region in addition to an elastic deformation region observed in the sole bodies, thus direct forming or working is possible. Moreover, by applying a conventional working method to the present composite material, the ceramic portion can have strength and elasticity. As a result, damage by an external force or deterioration of superconductive properties caused thereby can be prevented, and it is possible to provide a superconductive material having high reliability.

The present invention has the following effects. That is, the inventive material has a higher strength than that of a conventional superconductive sole ceramic body, and is also capable of being subjected to plastic working (deformation) and machining such as cutting.

In certain compositional ranges of the materials according to the present invention, the resistivity (several up to 10 μΩcm) is smaller than that of a superconductive sole ceramic body (order of $10^3$ μΩcm), and close to that of a mixed metal ($10^{-2}$-1 μΩcm) (Refer to FIG. 7).

Even a composite material which includes not less than 50% (up to 75%) of metal in volume ratio shows the Meissner effect, and only a small amount of decrease in the superconductive properties such as Tc and the like is observed (refer to FIG. 4 Tc≧80K for Ag≦66.7 vol %, and FIG. 9, only slight decrease in Jc Ag≦30 vol % and Jc≧25 A/cm² for Ag≦50 vol %) .

BRIEF DESCRIPTION OF THE DRAWINGS

FIG. 9 is a diagram showing dependency of critical current density Jc (* per entire material) on Ag volume concentration;

FIG. 10 is a diagram showing dependency of flexural strength on Ag volume concentration;

FIG. 11 is a diagram showing load-displacement characteristics at bending tests;

FIG. 12 is a diagram showing the critical temperature Tc as a function of Ag volume concentration with different pressing pressure;

FIG. 18 is a diagram showing the TCR as a function of Ag concentration with different YBCO particle sizes;

FIG. 19 is a diagram showing the resistivity ρ300K as a function of Ag concentration with different YBCO particle sizes;

FIG. 21 is a diagram showing the flexural strength as a function of Ag concentration with different YBCO grain sizes;

FIG. 22 represents diagrams (C)–(E) showing the temperature dependency of resistivity ρ(T)/ρ(300K) as a function of temperature at 66.7 vol % Ag with schematic representations of the microstructure of the composite bodies, respectively.

DETAILED DESCRIPTION OF PREFERRED EMBODIMENTS

Embodiments of the present invention will be hereinafter explained by reference to the Examples.

A composite material in which an Y-Ba-Cu-O system is used as a superconductive ceramic, and Ag is used as a metal will be hereinafter described in detail.

EXAMPLE 1

(1) Method for Preparing Samples

Commercial $YBa_2Cu_3O_{7-x}$ powder named "$YBa_2Cu_3O_x$ powder" was obtained by High Purity Chemicals Ca., Ltd., Sakado, Saltams-ken, jain dE the three nine purity grade (99.9% purity) having different particle size grades hereinbelow mentioned. This powder had a superconductive component of about 99% or above, Ag powders with different particle sizes were obtained from the same company.

Volume compositions of $YBa_2Cu_3O_{7-x}$ (abbreviated hereinafter YBCO) and Ag of prepared composite materials are shown in Table 1. The compositions of composite materials will be hereinafter represented by volume ratios.

Figure 1:
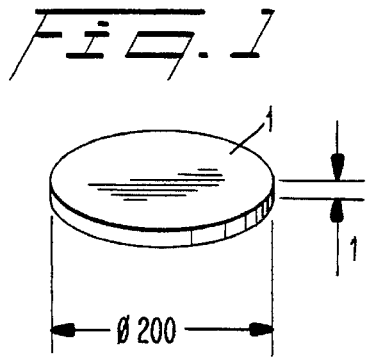
FIG. 1 is an explanatory diagram of a sintered sample.

A YBCO powder (100 mesh under containing grains finer than 200 mesh, and an Ag powder (100–200 mesh), purity of 99.9% were weighed so that a target composition was obtained. At this time, YBCO and Ag having densities of 6.0 and 10.5 g/cm³ were used, respectively. After having sufficiently mixed these powders, the resultant mixture was subjected to press forming into a disk 1 shown in FIG. 1 under an oil pressure of 200 kgf/cm² (0.4 MPa on the compact). The sample was then held in an electric furnace in 1-atm oxygen gas flow at 890° C. for 12 hours, and allowed to cool in the furnace for 5–6 hours until the temperature became 200° C. or below.

(2) Methods for Evaluating the Properties of Samples

Figure 2:
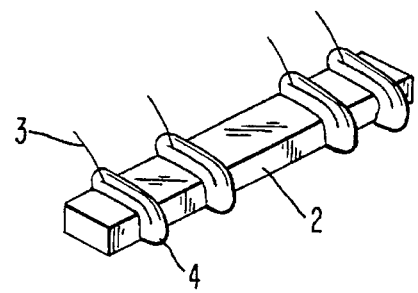
FIG. 2 shows appearance of a specimen for electric resistance measurement.

The measurement of electric resistance was performed by the DC four-terminal method within the temperature range 2–300K. FIG. 2 shows a specimen for measurement. In FIG. 2, there are shown a rod-like specimen 2, lead wires 3 consisting of gold wires and electrodes 4 made of a silver paste. The specimen was cut from the heat-treated disk-like sample 1 in FIG. 1 into a rod 2 having dimensions of 2 mm×1 mm×20 m. Gold wires having a diameter of 20 μm were used as lead wires 3, which were wound around the specimen, and contact with the specimen was provided by applying the silver paste 4 on the lead wires 3 and dried for one day. 10 mA current was applied, through the specimen and output voltage was measured by a nanovolt-meter. The measurement of the critical current density Jc was performed at liquid nitrogen temperature using the specimen used for the measurement of electric resistance. The current-voltage characteristics were measured at near the critical temperature with increasing the current through the specimen, and Jc was calculated from the current value when voltage was extrapolated to zero and the minimum cross section of the specimen. The voltage was measured inverting the current through the specimen and the resultant averaged value was used as the voltage value.

Magnetic susceptibility was measured by the AC method with an applied alternating magnetic field of 10 Oe at 80 Hz within the temperature range of 10–120 K.

Figure 3:
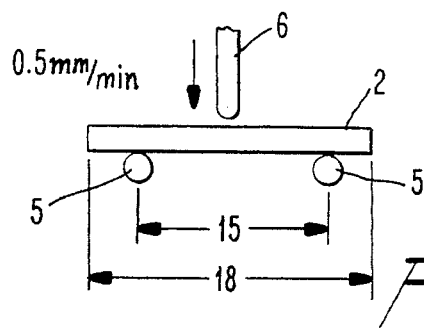
FIG. 3 is an explanatory diagram of the three-point bending test method.

Evaluation of mechanical properties was performed by the flexural strength test and rolling test. Specimens for the flexural strength measurement were cut out into dimensions of 3 mm×1 mm×18 mm, and the cut surfaces were polished by a polishing sand paper of #1000. The measurement was performed by the three-point bending method shown in FIG. 3 with 15 mm of the span distance between fulcrums 5, 5 and 0.5 mm/min of the speed of a cross head 6.

Rolling test was performed by hot rolling at 400° C. Test pieces were prepared by cutting the disk-like sample of 1 mm thickness (in FIG. 1) into halves. Rolling was performed several times reducing the nip distance between rolls of a rolling mill, and the reduction by rolling was calculated from the reduction in the thickness of the specimen.

(3) Properties of Materials

1) Electric Properties

Figure 5:
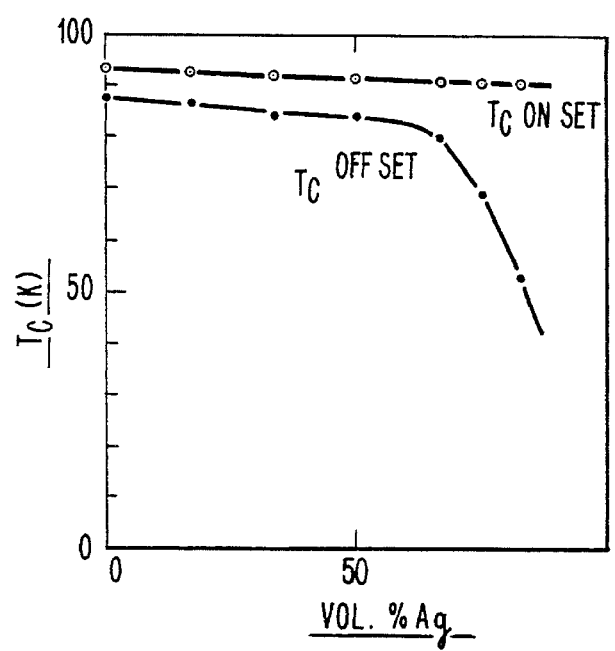
FIG. 5 is a diagram showing dependency of critical temperature Tc on Ag volume concentration.
Figure 4A:
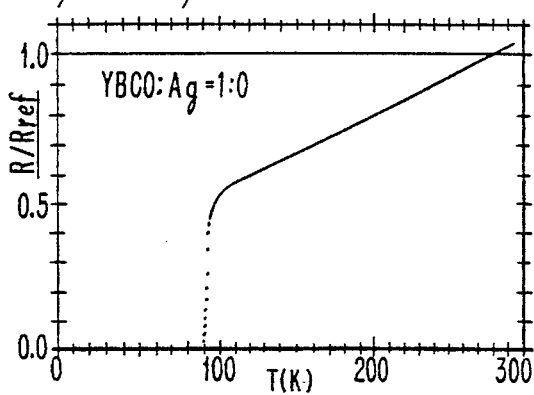
FIG. 4 shows electric resistance-temperature characteristics of YBCO-Ag composite materials.
Figure 4E:
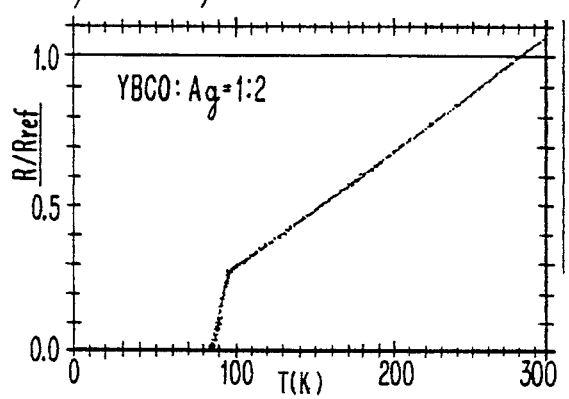
Figure 4B:
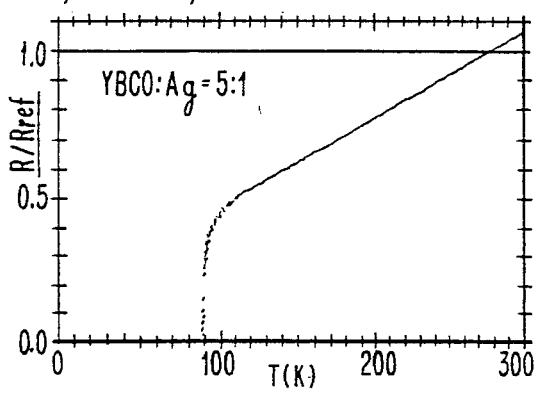
Figure 4F:
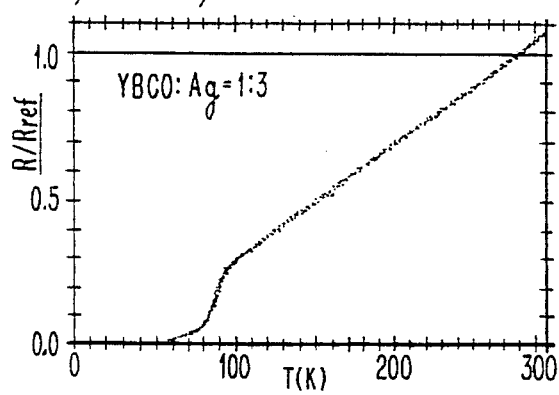
Figure 4C:
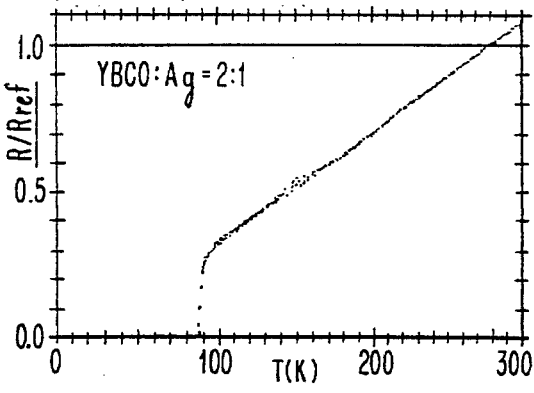
Figure 4G:
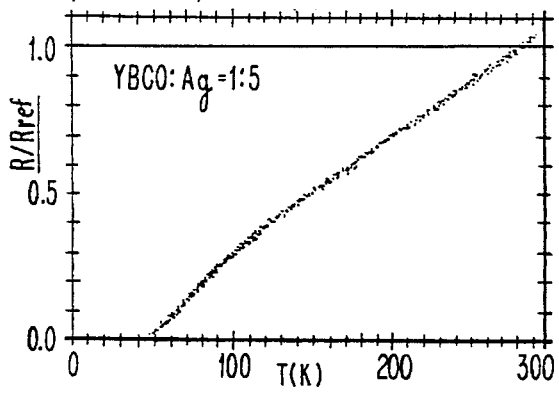
Figure 4D:
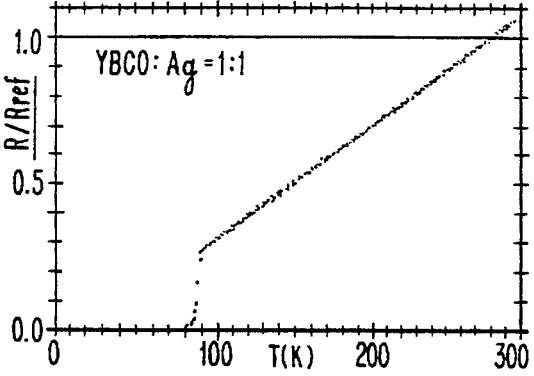
Figure 4H:
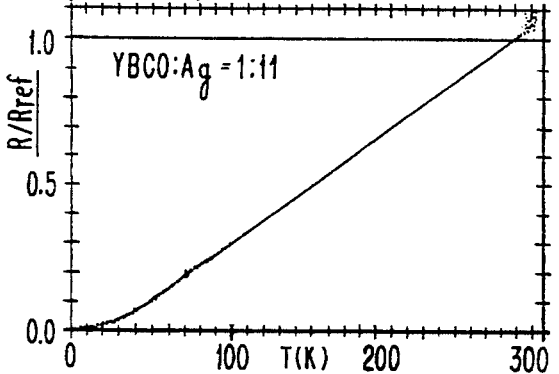
Figure 6:
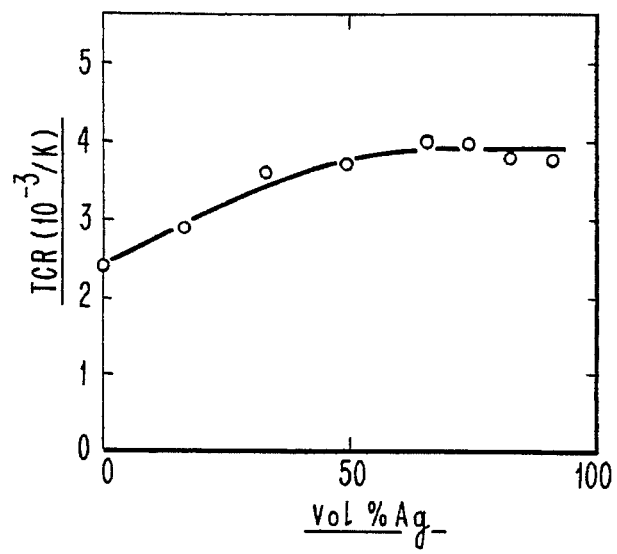
FIG. 6 is a diagram showing dependency of temperature coefficient of resistivity TCR at room temperature on Ag volume concentration.
Figure 7:
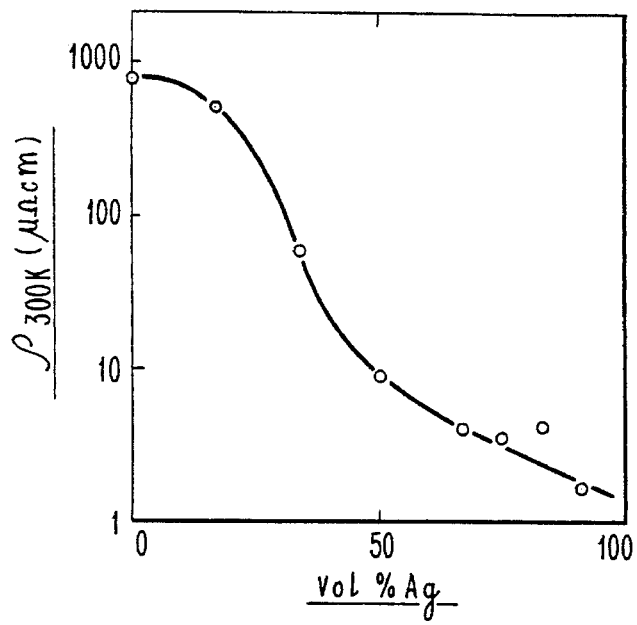
FIG. 7 is a diagram showing dependency of resistivity ρ300 K on Ag volume concentration.
Figure 8:
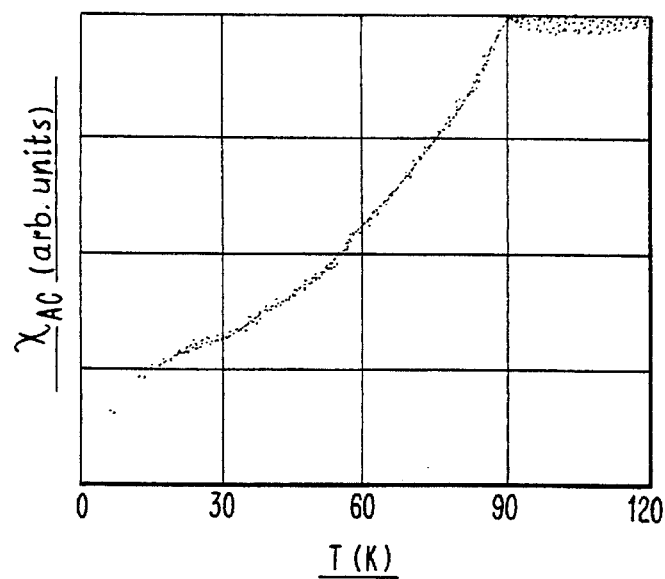
FIG. 8 is a diagram showing dependency of alternating magnetic susceptibility of YBCO:Ag=1:5 on temperature.

FIG. 4 shows electric resistance-temperature characteristics at various compositions. At any compositions, metallic normal conduction properties having positive temperature coefficients of resistivity (termed hereinafter TCR) are observed. Superconductive properties are observed up to the composition of YBCO:Ag=1:11 (91.7% Ag). FIGS. 5–7 show relationships between critical temperature Tc obtained from the resistance-temperature characteristics, TCR at room temperature and resistivity ρ300 K, as a function of the Ag concentration, respectively. FIG. 8 shows the result of the measurement of AC magnetic susceptibility at 83.3% Ag. As the critical temperatures, the superconductivity starting temperature $Tc^{onset}$ and the temperature $Tc^{offset}$ at which zero resistivity is observed are shown. When the amount of Ag is increased, $Tc^{offset}$ decreases from 88K which is the value for the pure YBCO, but $Tc^{offset}$ exceeding 80K is observed even at 66.7% Ag. At 83.3% Ag, $T^{offset}$ is 52K, and magnetic susceptibility indicates an abrupt occurrence of the diamagnetism at near 90K, and the Meissner effect is still observed even at Ag concentrations exceeding 80%. TCR and resistivity ρ300K change from the values for the pure YBCO toward the values for the pure Ag as the amount of Ag increases. At 66.7% Ag, a TCR of about the same level as for the pure Ag and a small resistivity having an order of μΩcm are observed.

FIG. 9 shows dependency of the critical current density Jc on the Ag concentration. Although Jc decreases when the amount of Ag is increased, magnitude of Jc which amounts to 83% of that for the pure YBCO is maintained even at 33% Ag. Data of electric properties are shown in Table 1 together with data of mechanical properties to be described later.

As described above, in composite materials of YBCO and Ag, a high $Tc^{offset}$ of the same degree as that for the pure YBCO and the Meissner effect are maintained even at compositions exceeding 60% Ag, and electric properties having both superconductive properties of the pure YBCO and normal-conductive properties of the pure Ag are observed.

2) Mechanical Properties

FIGS. 10 and 11 show the dependency of the flexural strength on the composition and the load-displacement characteristics, respectively. The flexural strength is linearly increased with the increase in Ag amount. In the present measurement, the flexural strength becomes doubled that of the pure YBCO at 50% Ag. In the load-displacement characteristics, with making 50% Ag as a border, regions in which the linearity disappears and the rupture finally occurs gradually appear, in addition to the elastic deformation regions wherein the displacement is proportional to load. This indicates that the plastic deformation is occurring in such regions, and so plastic working is possible. Actually, at compositions having not less than 67% Ag, disk-like samples placed within a quartz tube suffer warping along the inner surface of the tube by a heat treatment at 890° C. for 12 hours. At compositions having not less than 50% Ag, hot rolling at 400° C. is possible. Reductions by rolling were 23%, 38% and 42% for 50.0% Ag, 66.7% Ag and 75.0% Ag, respectively. In FIG. 11, numerals 1–8 indicate that the ratios YBCO:Ag are as follows: (1) 1:0 (0% Ag), (2) 5:1 (16.7% Ag), (3) 2:1 (33.3% Ag), (4) 1:1 (50.0% Ag), (5) 1:2 (66.7% Ag), (6) 1:3 (75.0% Ag), (7) 1:5 (83.3% Ag) and (8) 1:11 (91.7% Ag), respectively.

As described above, in the composite material of YBCO and Ag, it is possible to provide a strength which is several times larger than that of the pure YBCO by incorporating Ag, and plastic working such as rolling or the like, which is impossible for the pure YBCO, is also possible.

EXAMPLE 2

Properties depending on varied pressing pressures on the powder mixture of YBCO and Ag were investigated.

Using $Y_1Ba_2Cu_3O_x$(YBCO) powder (grain size of 100 mesh under) and Ag powder (grain size of 100–200 mesh) each having 99.9% purity as in Example 1, samples were prepared by compacting powder mixtures under different pressing pressures on compacts of 4 tonf/cm² (0.4 GPa) and 10 tonf/cm² (1 MPa) and sintering under the same conditions (890° C. for 12 hours in oxygen gas flow) as in Example 1.

Electric properties and mechanical properties were measured as in Example 1.

Figure 13:
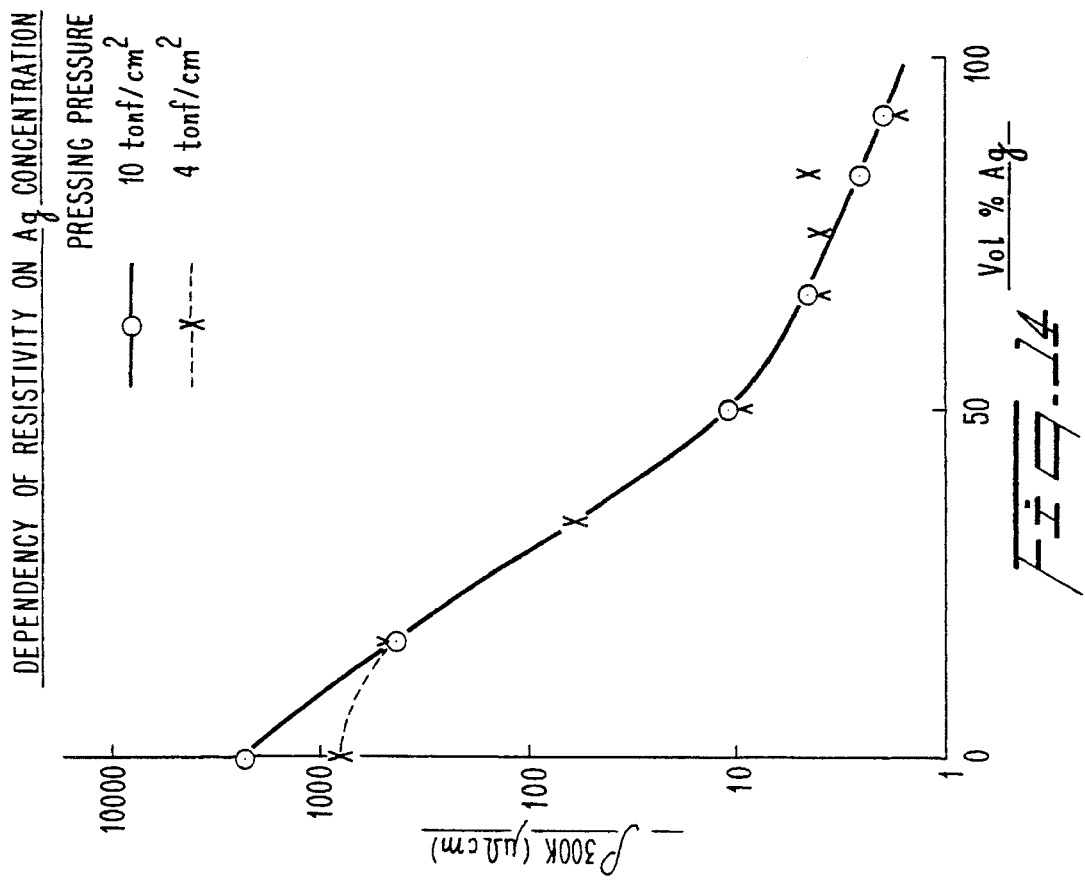
FIG. 13 is a diagram showing the TCR as a function of Ag volume concentration under different pressing pressure.
Figure 14:
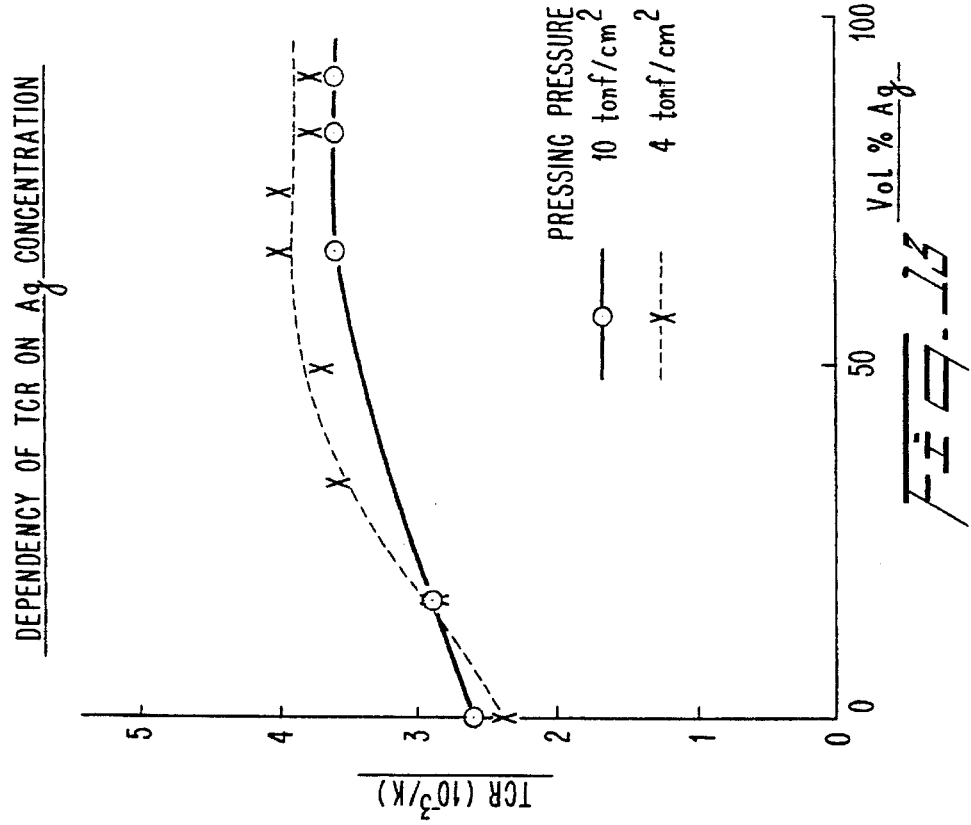
FIG. 14 is a diagram showing the resistivity ρ300K as a function of Ag volume concentration under different pressing pressure.
Figure 15:
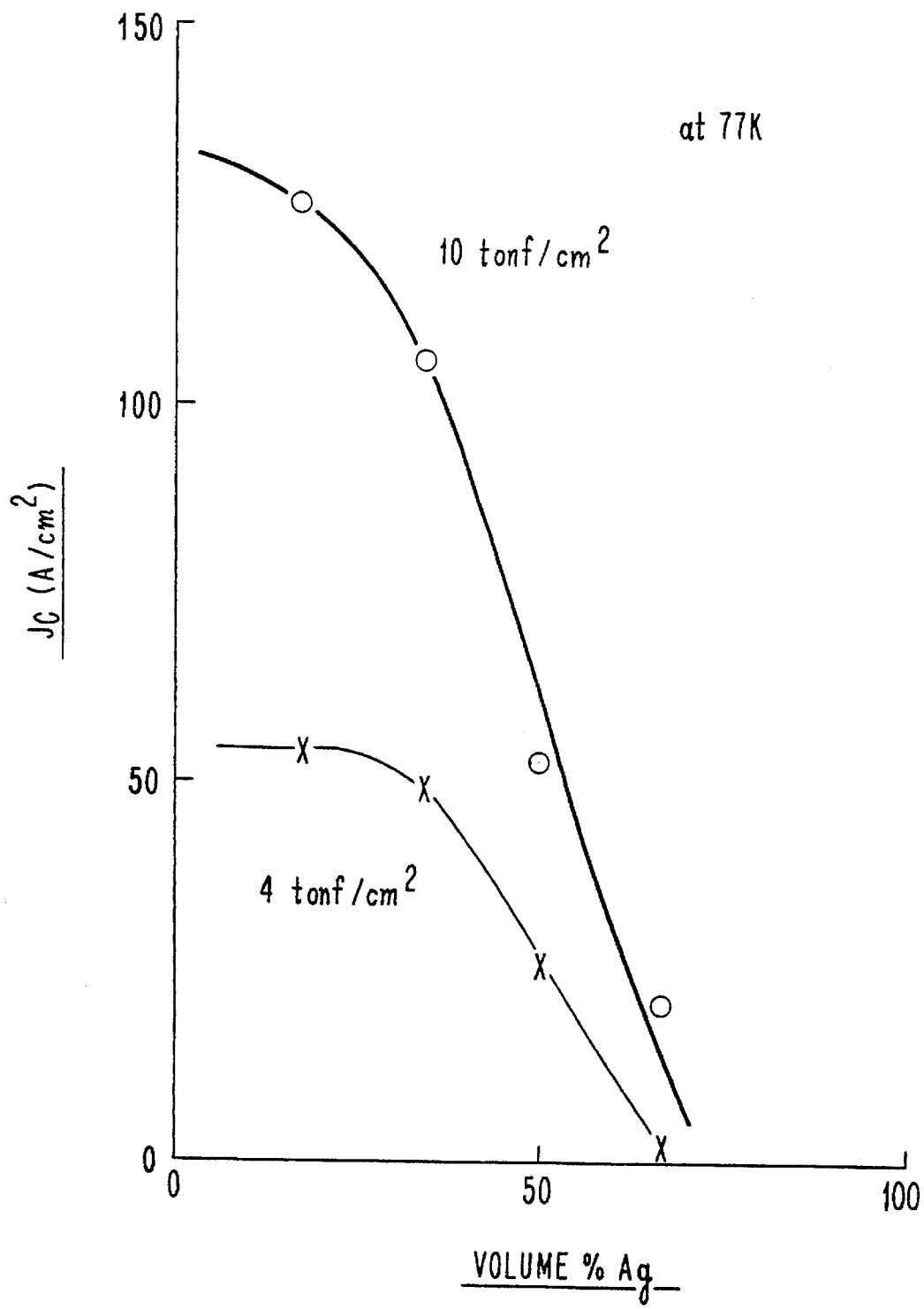
FIG. 15 is a diagram showing the critical current density Jc (*) as a function of Ag volume concentration under different pressing pressures.

Certain electric properties Tc (FIG. 12), TCR (FIG. 13), ρ300k (FIG. 14) show no significant difference, however, the critical current density Jc (FIG. 15) increases (approximately doubled) with the increased pressing pressure. The increase in Jc is observed even at a slight amount of Ag.

Figure 16:
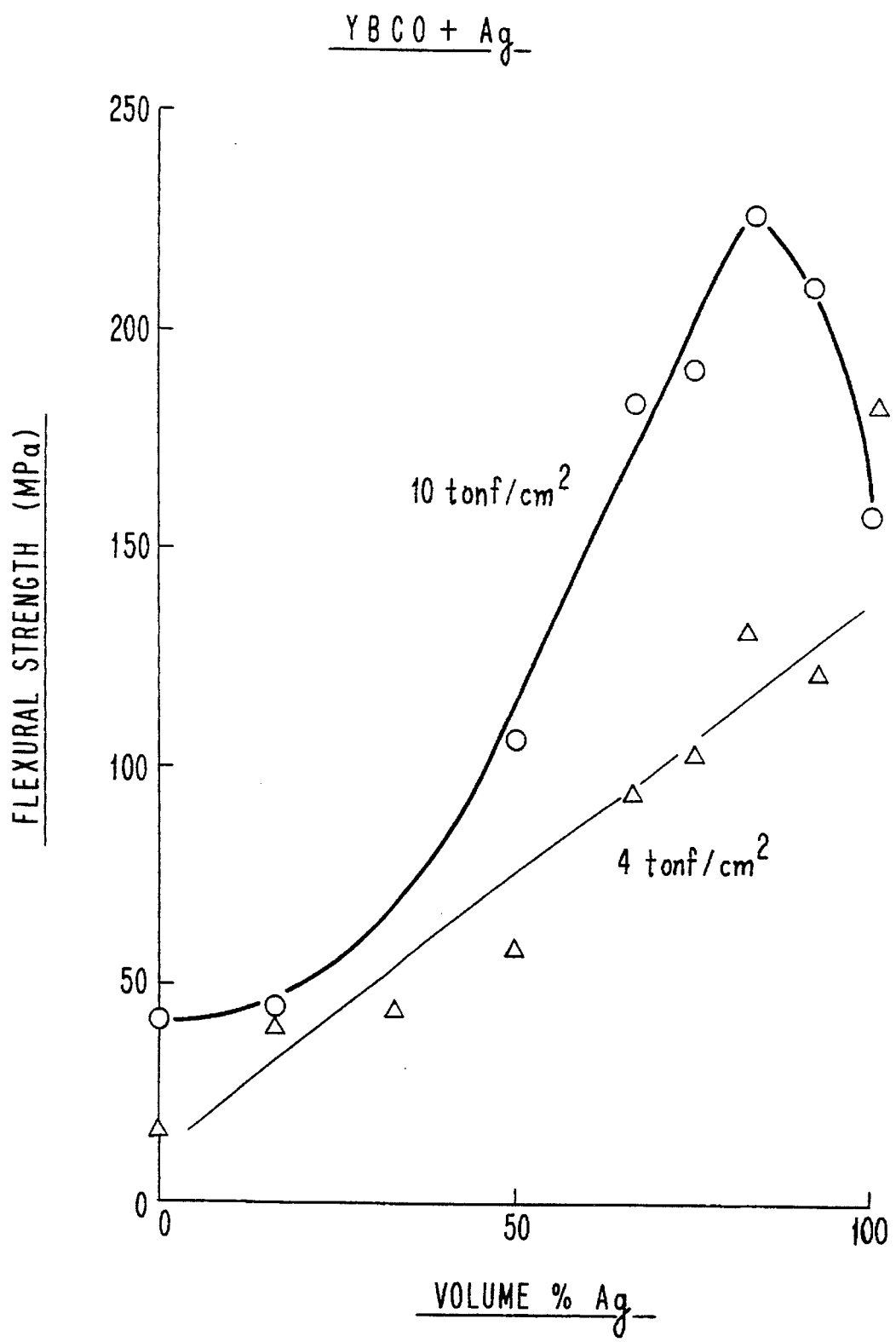
FIG. 16 is a diagram showing the flexural strength as a function of Ag volume concentration under different pressing pressure.

As for the mechanical properties, the following was observed: The flexural strength (FIG. 16) increases by about 1.8 times at 50 vol % Ag and about 1.9 times at 66.7 vol % Ag. The tested flexural strength above 83.3 vol % Ag shows a decrease after the peak, which decrease is believed to be attributable to the occurrence of pores in the sintered samples.

The measured values are summarized in Table 2. As observed above, the increased pressing pressure can significantly improve the critical current density Jc and flexural strength.

EXAMPLE 3

Properties depending on the grain sizes of YBCO and Ag powders, particularly the relative grain size to each other, were investigated.

The following different particle sizes were employed for the experiments using YBCO and Ag powders having 99.9% purity:

| Powder | A | B |
|---|---|---|
| $Y_1Ba_2Cu_3O_x$ | −325 mesh | −100 mesh |
| Ag | 100–200 mesh | 100–200 mesh |

Case A: YBCO powder particle size < Ag powder particle size
Case B: YBCO powder particle size ≈ Ag powder particle size
(same as in Example 2)

The pressing pressure was 1 MPa and the conditions for the sintering were the same as in Example 2. The electrical properties and mechanical properties were measured as in Example 1 and the following results were observed.

Figure 17:
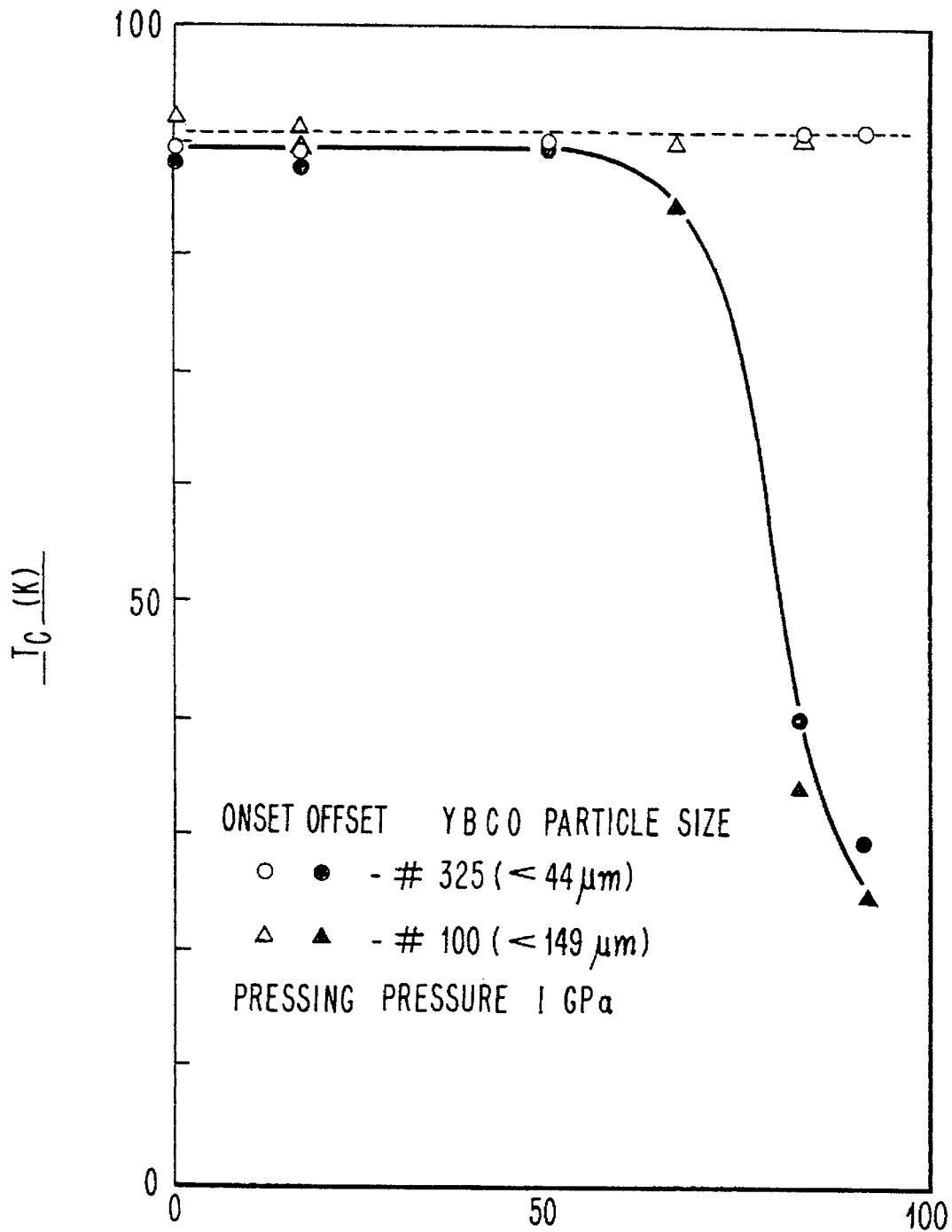
FIG. 17 is a diagram showing the Tc as a function of Ag concentration with different YBCO particle sizes.
Figure 20:
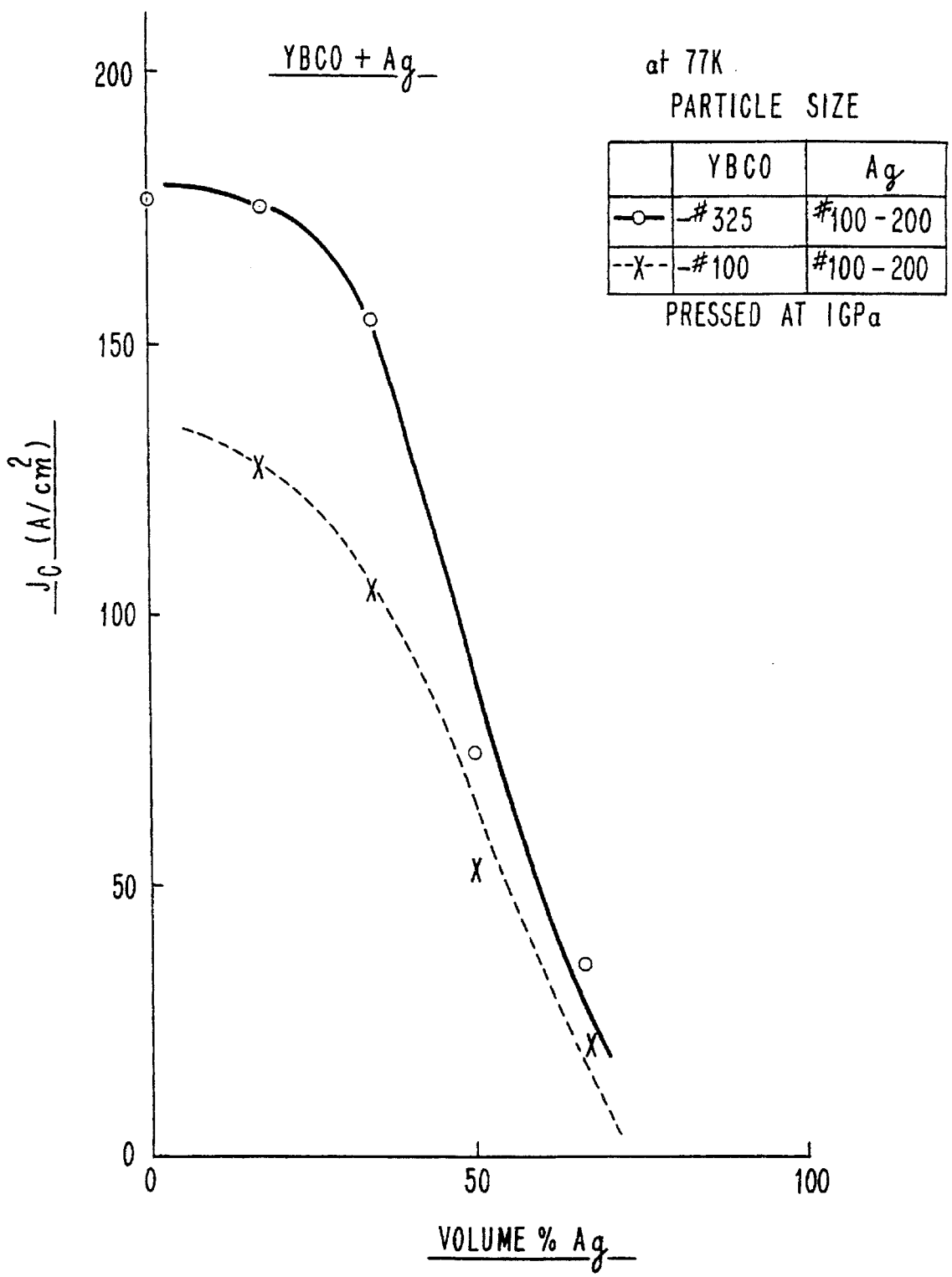
FIG. 20 is a diagram showing the Jc (*) as a function of Ag concentration with different YBCO particle sizes.

As for the electric properties, Tc (FIG. 17), TCR (FIG. 18) and ρ300k (FIG. 19) show not much difference, however, Jc (FIG. 20) increases by about 1.4 times. The increased magnitude is more significant at a lower content of Ag (less than 50 vol %, particularly less than 40 vol %).

As for the mechanical properties, the flexural properties (FIG. 21) do not show significant difference between tested samples.

The test results are summarized in Table 3.

EXAMPLE 4

Properties depending on the grain sizes, particularly in the case where the Ag powder is finer than the YBCO powder, were investigated at a composition YBCO:Ag=1:2 by volume.

Following different particle sizes were employed for the experiments using YBCO and Ag powders each having 99.9% purity:

| Powder | C | D | E |
|---|---|---|---|
| $Y_1Ba_2Cu_3O_x$ | n = −100 mesh | f | −100 mesh |
| Ag | 100–200 mesh | F | F |

YBCO powder f: powder pulverized by an agate mortar from powder n
Ag powder F: about 2 μm (powder for Ag paste)

Pressing was conducted under a pressing pressure upon the compacts 2 tonf/cm² (0.2 MPa) and the sintering was effected under the same conditions as Example 2.

The electric resistivity as a function of the temperature was measured and corresponding structure was observed by scanning electron microscopy (SEM). The results are shown in FIG. 22, in which righthand encircled figures represent the schematic phase structures with different grain distributions, respectively.

In case (C), the same as Example 1 where the YBCO powder is finer than the Ag powder, the Ag powder is distributed (or isolated) in the YBCO matrix of a continuous network. This results in a superconductive phenomenon similar to the pure YBCO.

In case (E) where the Ag powder is finer than the YBCO powder, the fine Ag powder grains prohibit the YBCO grains from sintering to prohibit the YBCO from forming a continuous network. This results in a nonsuperconductive state which is similar to the pure Ag in the resistivity-temperature characteristics.

In case (D) where the difference in the grain size between the Ag powder and YBCO powder is reduced (i.e., both the grain sizes are near the same), partial and local YBCO networks are produced distributed in the relatively developed Ag network. This to the reduction in the resistivity near the superconducting transition temperature of YBCO.

Based on these experiments, the grain size of the Ag powder should be selected so as not to prohibit the YBCO network formation in order to avoid deterioration in the superconductive properties (Tc and Jc) of the base YBCO upon making a composite body with Ag. Namely the Ag powder should have a grain size no less than the YBCO powder. As for the YBCO powder, a powder having a certain width of the grain size distribution containing fine grains less than about 2 μm so that a network surrounding the Ag grain or grains can be formed.

Figure 23:
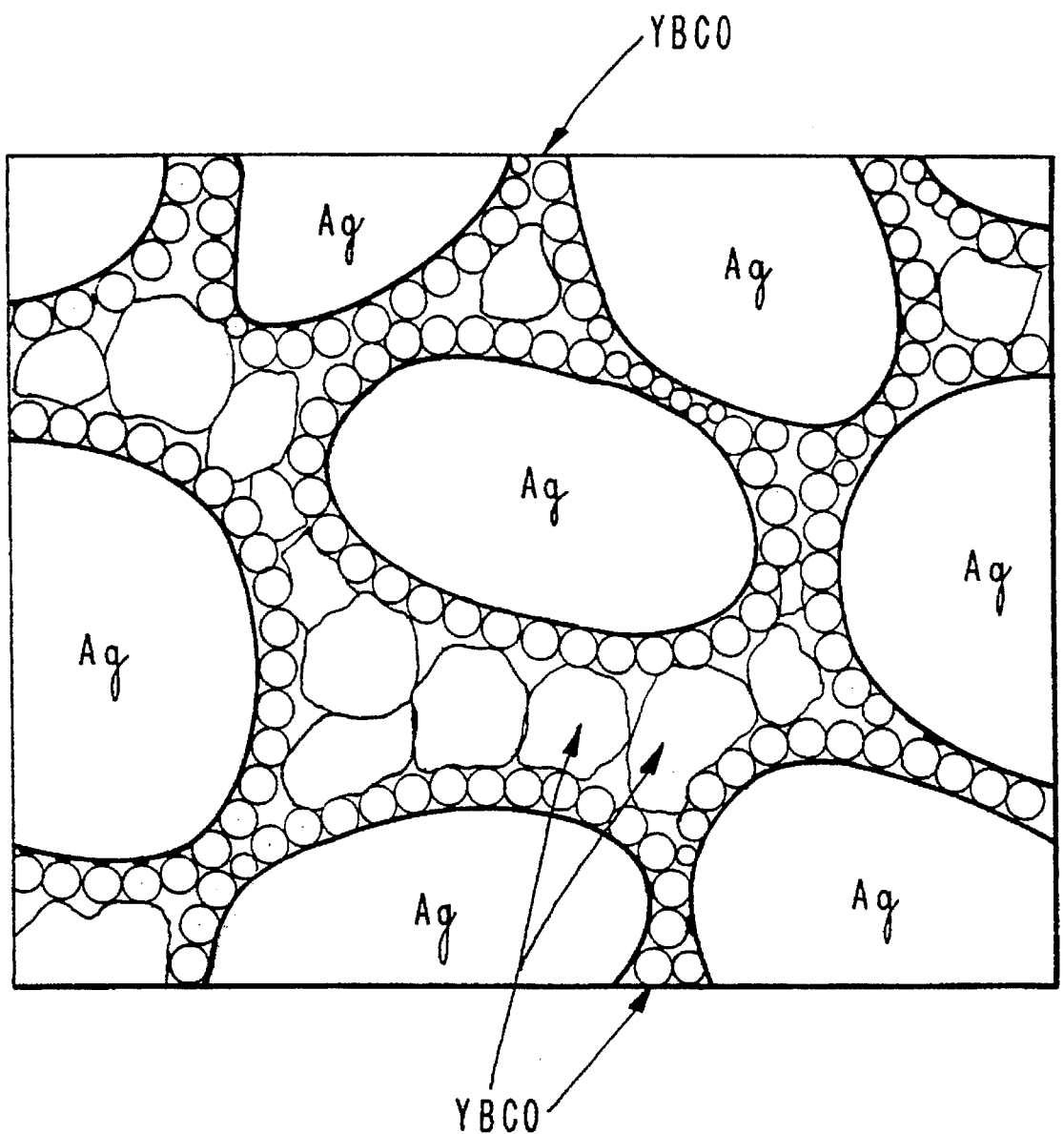
FIG. 23 is a detailed schematic representation of the microstructure of FIG. 22(C).

Further, a typical phase structure of the YBCO/Ag composite body is schematically shown in detail in FIG. 23, which represents Example 4(c)=FIG. 22(c) at YBCO:Ag= 1:2 with YBCO powder of 100 mesh under and Ag powder of 100 to 200 mesh. Fine YBCO grains surround large Ag grains and form a continuous network with YBCO grains of an intermediate size.

EXAMPLE 5

Soldering property of the YBCO/Ag composite body has been investigated as follows. To the samples produced according to Example 1 were soldered a copper lead wire (0.1 mm diameter) directly with a soldering rod. Then the soldered units were cooled down to the liquid helium temperature, at which the electric resistance was measured by using the direct current four terminal method and the contact property (ohmic contact) of the soldering was tested.

The soldering was possible for the samples with the Ag amount of 50 vol % or more, and no scaling off or loosening of the solder and lead wire from the composite body was observed even after cooled down to 4.2K. The superconductive state showing zero resistivity was observed at 4.2K and the ohmic contact with the composite body was satisfactory.

Thus, it was confirmed that the inventive YBCO/Ag composite bodies have good soldering property suitable for use in the electronics field even without additional measures to ensure soldering. The brazing property is also believed to be satisfactory based on the above good soldering property so far as it is brazed below the temperature at which the composite body deteriorates.

TABLE 1

| Nos. | YBCO:Ag by volume | $Tc^{offset}/Tc^{onset}$ (K) | TCR ($10^{-3}$/K) | $\rho_{300K}$ (μΩcm) | Jc 77K (A/cm²) | Flexural Strength (MPa) | Reduction by Rolling (%) |
|---|---|---|---|---|---|---|---|
| 1 | 1:0 (0 vol % Ag) | 87.5/92.5 | 2.4 | 800 | 55 | 18 | — |
| 2 | 5:1 (16.7 vol % Ag) | 87.3/92.0 | 2.9 | 500 | 54 | 42 | — |
| 3 | 2:1 (33.3 vol % Ag) | 84.3/92.0 | 3.6 | 60 | 50 | 45 | — |
| 4 | 1:1 (50.0 vol % Ag) | 83.3/90.5 | 3.7 | 9 | 26 | 59 | 23 |
| 5 | 1:2 (66.7 vol % Ag) | 80.0/90.0 | 4.0 | 4.1 | 2 | 95 | 38 |
| 6 | 1:3 (75.0 vol % Ag) | 68.3/89.5 | 4.0 | 3.6 | — | 105 | 42 |
| 7 | 1:5 (83.3 vol % Ag) | 52.4/90.0 | 3.8 | 4.3 | — | 132 | — |
| 8 | 1:11 (91.7 vol % Ag) | — | 3.8 | 1.7 | — | 121 | — |
| 9 | Ag* | — | 4.1 | 0.016 | — | — | — |

*values in a literature

TABLE 2

| Nos. | YBCO:Ag by volume | $T_c^{offset}/T_c^{onset}$ (K) | TCR ($10^{-3}$/K) | $\rho_{300K}$ ($\mu\Omega$cm) | Jc 77K (A/cm$^2$) | Flexural Strength (MPa) |
|---|---|---|---|---|---|---|
| 1 | 1:0 (0 vol % Ag) | 88.4/92.2 | 2.6 | 2400 | — | 42.1 |
| 2 | 5:1 (16.7 vol % Ag) | 89.2/91.3 | 2.9 | 430 | 127 | 45.1 |
| 3 | 2:1 (33.3 vol % Ag) | — | — | — | 106 | — |
| 4 | 1:1 (50.0 vol % Ag) | — | — | 10.5 | 53 | 106 |
| 5 | 1:2 (66.7 vol % Ag) | 85.7/90.0 | 3.6 | 4.6 | 21 | 183 |
| 6 | 1:3 (75.0 vol % Ag) | — | — | — | — | 191 |
| 7 | 1:5 (83.3 vol % Ag) | 34.5/90.0 | 3.6 | 2.6 | — | 226 |
| 8 | 1:11 (91.7 vol % Ag) | 25.9/ | 3.6 | 2.0 | — | 210 |
| 9 | 0:1 (100 vol % Ag) | — | — | — | — | 158 |

TABLE 3

| Nos. | YBCO:Ag by volume | $T_c^{offset}/T_c^{onset}$ (K) | TCR ($10^{-3}$/K) | $\rho_{300K}$ ($\mu\Omega$cm) | Jc 77K (A/cm$^2$) | Flexural Strength (MPa) |
|---|---|---|---|---|---|---|
| 1 | 1:0 (0 vol % Ag) | 88.0/89.4 | 2.6 | 4000 | 177 | 81.1 |
| 2 | 5:1 (16.7 vol % Ag) | 87.9/89.0 | 2.8 | 650 | 176 | 52.3 |
| 3 | 2:1 (33.3 vol % Ag) | — | — | 30 | 155 | 64.1 |
| 4 | 1:1 (50.0 vol % Ag) | 89.3/90.0 | 3.6 | 4 | 76 | 124 |
| 5 | 1:2 (66.7 vol % Ag) | — | — | — | 35.4 | 185 |
| 6 | 1:3 (75.0 vol % Ag) | — | — | — | — | 193 |
| 7 | 1:5 (83.3 vol % Ag) | 39.8/90.8 | 3.7 | 2.7 | — | 236 |
| 8 | 1:11 (91.7 vol % Ag) | 29.6/90.6 | 3.7 | 2.3 | — | 174 |

(4) The Composite Materials of the Same Kinds Having Similar Properties and Applications of the Same The above-described electric and mechanical properties are provided because YBCO and Ag are sintered without mutually reacting by a heat treatment (at 890° C.). At relatively lower Ag concentrations (about 50 vol % Ag or less) or at YBCO grains relatively finer than Ag, the relatively fine YBCO grains surround Ag grains and YBCO regions having high packing densities are produced. Hence, the sinterability of YBCO itself is increased. On the other hand, at relatively higher Ag concentrations, YBCO networks are formed during the sintering, and Ag is sintered without destroying the local YBCO networks. This is understood by FIG. 22(D) in which Tc lowering (to 80K) is only slight even at ⅔ vol Ag. In the composite materials of the present invention, by means of thus sintering a mixed powder of superconductive ceramics and metal at a temperature not more than the melting points of both constituents, improvement in the mechanical properties and the integration of the electric properties of the both constituents are provided. Accordingly, when a noble metal, such as Au, Pt, Pd and the like, which is chemically stable as a single substance and does not disturb the crystal structure and oxygen content of a ceramics having superconductive properties is added to rare-earth superconductive ceramics which have been known at present, similar properties can also be obtained. Electric and mechanical properties of these composite materials depend on the grain size of a raw material powder to be used, and preparation conditions such as the pressure at pressing and the like. Hence, the properties exceeding the above-described properties can be realized by optimizing the conditions.

In the present composite materials, since the strength and workability are improved without deteriorating the superconductive properties of sole ceramic bodies by admixing metal, these materials can be used for all applications which have hitherto been attempted. Moreover, since a low-resistance pure metal is included within a matrix material, the present composite materials are extremely useful for production and stabilization of superconductive wires and connection with normal-conductive wires due to good soldering property.

It should be understood that while the invention has been described with reference to the foregoing embodiments, various changes and modifications may be made thereto which fall within the scope of the appended claims.

We claim:

1. A process for producing a sintered superconductive ceramic composite material having a continuous network of superconductive ceramic material and a critical temperature of at least 4.2K comprising:

preparing a powder mixture of a superconductive powder and at least 5 vol. % of a silver or silver alloy metal powder having a melting point of about 1300° C. or less, the superconductive powder being finer in size than the metal powder, the superconductive powder being represented by $(RE_xAE_{1-x})_{1-y}Cu_yO_z$ where RE represents Y or a rare-earth element having an atomic number of 57–71, or a combination of at least two of these elements, AE is at least one of alkaline earth elements Ca, Sr and Ba, x is 0.13–0.67, y is 0.25–0.67, and z is 1.08–1.17, and solid phase diffusion sintering the resultant mixture in a fresh oxygen atmosphere under the conditions such that the powder mixture is densified and a continuous network of a superconducting phase of said superconducting powder is formed, the sintering being performed at a temperature below the melting point of the metal powder.

2. The process as set forth in claim 1, in which the sintering is effected at a temperature of 800° to less than 950° C.

3. The process as set forth in claim 1, in which the superconductive powder and the metal powder are present at a volumetric ratio of 90:10 to 5:95.

4. The process as set forth in claim 1, in which the superconductive powder and the metal powder are present at a volumetric ratio of 90:10 to 30:70.

5. The process as set forth in claim 1, in which the superconductive powder and the metal powder are present at a volumetric ratio of 1: no more than 11.

6. The process as set forth in claim 1, in which the superconductive powder and the metal powder are present at a volumetric ratio of 1: no more than about 2.

7. The process as set forth in claim 1, in which the superconductive powder and the metal powder are present at a volumetric ratio of 1: greater than 1.

8. The process as set forth in claim 1, in which the superconductive powder and the metal powder are present at a volumetric ratio between 2:1 and 1:5.

9. The process as set forth in claim 1, in which said powder mixture is charged and sintered in a metallic container or interposed between at least two metal layers.

10. The process as set forth in claim 9, in which before the sintering step, the powder mixture is first subjected to plastic deformation followed by sintering.

11. The process as set forth in claim 1, in which said metal powder is at least partly replaced by silver oxide which release oxygen during the sintering.

12. The process as set forth in claim 1, in which said metal powder has a melting point of 1300° C. or less.

13. The process as set forth in claim 1, which further comprises plastic deformation of the resultant sintered body.

14. The process as set forth in claim 13, in which said plastic deformation is followed by a heat treatment to resinter the deformed body.

15. The process as set forth in claim 1, in which RE is Y and AE is Ba.

16. A process for producing a sintered superconductive ceramic composite material having a continuous network of silver conductive ceramic material and if critical temperature of at least 4K comprising:

preparing a powder mixture of a superconductive powder and at least 5 vol. of a silver or silver alloy metal powder having a melting point of 1300° C. or less, the superconductive powder being finer in size than the metal powder, the superconductive powder being represented by $(RE_xAE_{1-x})_{1-y}Cu_yO_z$ where RE represents Y or a rare-earth element having an atomic number of 57–71, or a combination of at least two of these elements, AE is at least one of alkaline earth elements Ca, Sr and Ba, x is 0.13–0.67, y is 0.25–0.67, and z is 1.08–1.17, and solid phase diffusion sintering the resultant mixture in a fresh oxygen atmosphere under the conditions such that the powder mixture is densified and a continuous network of a superconductive phase of said superconductive powder is formed, the sintering being effected at a temperature of 800°–960° C., the sintering being performed at a temperature below the melting point of the metal powder.

17. A process for producing a sintered superconductive ceramic composite material having a continuous network of superconductive ceramic material and a critical temperature of at least 4K comprising:

preparing a powder mixture of a superconductive powder and a silver or silver alloy metal powder having a melting point of about 1300° C. or less, the superconductive powder being finer in size than the metal powder, the superconductive powder being represented by $(RE_xAE_{1-x})_{1-y}Cu_yO_z$ where RE represents Y or a rare-earth element having an atomic number of 57–71, or a combination of at least two of these elements, AB is at least one of alkaline earth elements Ca, Sr and Ba, x is 0.13–0.67, y is 0.25–0.67, and z is 1.08–1.17, the superconductive powder and the metal powder being present at a volumetric ratio of 90:10 to 5:95, charging said powder mixture into a metallic container or interposed between at least two metal layers, and solid phase diffusion sintering the resultant mixture in a fresh oxygen atmosphere under the conditions such that the powder mixture is densified and a continuous network of a superconductive phase of said superconductive powder is formed, the sintering being effected at a temperature of 800°–960° C., the sintering being performed at a temperature below the melting point of the metal powder.

18. The process as set forth in claim 17, in which before the sintering step, the powder mixture is first subjected to plastic deformation followed by sintering.

19. The process as set forth in claim 17, in which said metal powder is at least partly replaced by silver oxide which release oxygen during the sintering.

20. The process as set forth in claim 17, which further comprises plastic deformation of the resultant sintered body.

21. The process as set forth in claim 20, in which said plastic deformation is followed by a heat treatment to resinter the deformed body.

* * * * *